United States Patent
Tai et al.

(10) Patent No.: US 9,800,234 B2
(45) Date of Patent: Oct. 24, 2017

(54) CLOCK AND DATA RECOVERY CIRCUIT AND PHASE INTERPOLATOR THEREFOR

(71) Applicant: LONTIUM SEMICONDUCTOR CORPORATION, Hefei, Anhui (CN)

(72) Inventors: Lianliang Tai, Hefei (CN); Hongfeng Xia, Hefei (CN); Xi Xu, Hefei (CN); Diansheng Ren, Hefei (CN); Cheng Tao, Hefei (CN); Feng Chen, Hefei (CN)

(73) Assignee: LONTIUM SEMICONDUCTOR CORPORATION, Hefei, Anhui (CN)

( * ) Notice: Subject to any disclaimer, the term of this patent is extended or adjusted under 35 U.S.C. 154(b) by 0 days.

(21) Appl. No.: 15/220,656

(22) Filed: Jul. 27, 2016

(65) Prior Publication Data

US 2017/0187361 A1   Jun. 29, 2017

(30) Foreign Application Priority Data

Dec. 29, 2015 (CN) .......................... 2015 1 1022184

(51) Int. Cl.
*H03K 5/135* (2006.01)
*H03L 7/08* (2006.01)
*H04L 7/033* (2006.01)
*H03K 5/00* (2006.01)

(52) U.S. Cl.
CPC ........... *H03K 5/135* (2013.01); *H03L 7/0807* (2013.01); *H04L 7/0331* (2013.01); *H04L 7/0332* (2013.01); *H03K 2005/00052* (2013.01)

(58) Field of Classification Search
CPC ....... H03K 5/135; H03L 7/0807; H04L 7/033; H04L 7/0331; H04L 7/0332
See application file for complete search history.

(56) References Cited

U.S. PATENT DOCUMENTS

| | | | |
|---|---|---|---|
| 7,069,458 B1 * | 6/2006 | Sardi ..................... | H04L 7/0338 327/152 |
| 2003/0183842 A1 * | 10/2003 | Kizer ....................... | G06F 1/10 257/158 |
| 2008/0231331 A1 * | 9/2008 | Balraj ....................... | G06F 1/04 327/145 |
| 2012/0109356 A1 * | 5/2012 | Kong ..................... | H04L 7/033 700/121 |

* cited by examiner

*Primary Examiner* — David B. Lugo
(74) *Attorney, Agent, or Firm* — Yue Xu; U.S. Fairsky LLP

(57) ABSTRACT

A clock and data recovery circuit and a phase interpolator therefor are provided. The clock and data recovery circuit includes a phase-locked loop, a control unit and the phase interpolator, a receiving circuit, a serial-to-parallel conversion circuit. The phase interpolator is connected with the control unit of the clock and data recovery circuit, and the phase interpolator includes: an encoding circuit, two multiplexers, a clock mixer, and two differential to single-ended amplifiers. The control unit is configured to further control the encoding circuit to change a delay position for a clock outputted by the phase interpolator in a case that the data sampled in the current clock position is not the optimal sampled data, to lead or lag the clock, thereby forming a stable state in which the clock follows the data dynamically.

13 Claims, 8 Drawing Sheets

CLOCK AND DATA RECOVERY CIRCUIT AND PHASE INTERPOLATOR THEREFOR

CROSS REFERENCE OF RELATED APPLICATION

The present application claims the priority to Chinese Patent Application No. 201511022184.2, titled "CLOCK AND DATA RECOVERY CIRCUIT AND PHASE INTERPOLATOR THEREFOR", filed on Dec. 29, 2015 with the State Intellectual Property Office of the People's Republic of China, the content of which is incorporated herein by reference in its entirety.

FIELD

The present disclosure relates to the field of clock and data recovery technology, and in particular to a clock and data recovery circuit and a phase interpolator therefor.

BACKGROUND

In a receiving terminal of a serial communication system, a clock and data recovery circuit (CDR) is used to extract a clock and recovery data from the received serial data stream, and performance of the CDR directly restricts communication quality. A phase interpolator (PI) is used to adjust a clock phase sampled in the CDR to realize correct sampling of data. The PI capable of accurately adjusting the clock phase is very important for a case that data from a transmitting terminal can be recovered correctly at the receiving terminal.

In an actual application, a sampling clock edge resulted from a sudden phase jump may occur in an operation process of the CDR due to phase drift of the transmitting clock, environment temperature change, or power supply voltage variation, which reduces jitter performance, and directly deteriorates dynamic performance of the CDR.

SUMMARY

In view of this, a clock and data recovery circuit and a phase interpolator therefor are provided according to the present disclosure, so as to solve a problem in the conventional technology that the dynamic performance of the clock and data recovery circuit is poor.

A phase interpolator for a clock and data recovery circuit is provided. The phase interpolator is connected with a control unit of the clock and data recovery circuit, and the phase interpolator includes: an encoding circuit, two multiplexers, a clock mixer, and two differential to single-ended amplifiers. An input terminal of the encoding circuit is connected with the control unit, and the encoding circuit is configured to: sample a data control signal outputted by the control unit based on a received parallel clock to generate a sampled signal, sample the sampled signal based on a received sampling clock or a received multi-phase clock group to determine a reference data value, and process the reference data value and a phase control signal outputted by the control unit to generate a first code and a second code. A control terminal of each of the two multiplexers is connected with an output terminal of the encoding circuit, and each of the two multiplexer is configured to receive the second code, select two phase clocks from received N phase clocks based on the second code and output the selected two phase clocks, where N is an even number greater than or equal to 4. A control terminal of the clock mixer is connected with an output terminal of the encoding circuit, input terminals of the clock mixer are connected with output terminals of the two multiplexers, the clock mixer is configured to receive the first code, perform a weighting analog operation on the received two phase clocks based on the first code to generate and output a new phase clock. An input terminal of each of the two differential to single-ended amplifiers is connected with an output terminal of the clock mixer, and each of the two differential to single-ended amplifiers is configured to amplify a small signal outputted by the clock mixer to a full swing signal.

Preferably, the encoding circuit includes: a first sampling unit, a second sampling unit, a first delay unit, a determination unit, a first operation unit, a second operation unit, a one-hot code logical unit, and a thermometer code logical unit. The first sampling unit is configured to sample the data control signal outputted by the control unit based on the received parallel clock to generate a sampled signal. The second sampling unit is configured to sample the sampled signal based on the received sampling clock or the received multi-phase clock group to determine the reference data value. The first delay unit is configured to delay highest three bits of the reference data value for two cycles of the parallel clock to obtain a highest-three-bit delay value. The determination unit is configured to perform logical processing on the highest three bits of the reference data value and the highest-three-bit delay value to determine whether cross-quadrant occurs. The first operation unit is configured to perform a logical operation on lower four bits of the reference data value based on a determination result of the determination unit to obtain a lower-four-bit operation value. The second operation unit is configured to obtain a lowest-bit operation value based on the determination result of the determination unit and the phase control signal outputted by the control unit. The one-hot code logical unit is configured to perform one-hot code logical processing on the highest-three-bit delay value to generate the second code. The thermometer code logical unit is configured to perform thermometer code logical processing on the lower-four-bit operation value and the lowest-bit operation value to generate the first code, and the lowest bit of the first code is generated by separately encoding the lowest-bit operation value.

Preferably, in a case that the determination result of the determination unit is that cross-quadrant occurs, the first operation unit and the second operation unit are configured to transfer all weights to a side of a bordering phase to change a phase once, the one-hot code logical unit is configured to change a phase of the second code, and the thermometer code logical unit is configured to change a phase of the first code.

Preferably, the data control signal and the phase control signal outputted by the control unit are binary-encoded.

Preferably, the clock mixer includes M current switching units, a third resistor, a fourth resistor, a first NMOS transistor, a second NMOS transistor, a third NMOS transistor and a fourth NMOS transistor, where M is a natural number greater than 1. Both one terminal of the third resistor and one terminal of the fourth resistor are connected with a power supply. The other terminal of the third resistor, a drain of the first NMOS transistor and a drain of the third NMOS transistor are connected together, with a connection point acting as an output terminal of the clock mixer. The other terminal of the fourth resistor, a drain of the second NMOS transistor and a drain of the fourth NMOS transistor are connected together, with a connection point acting as another output terminal of the clock mixer. A source of the first NMOS transistor is connected with a source of the second NMOS transistor, with a connection point connected with first output terminals of the M current switching units. A source of the third NMOS transistor is connected with a source of the fourth NMOS transistor, with a connection point connected with second output terminals of the M current switching units. A gate of the first NMOS transistor, a gate of the second NMOS transistor, a gate of the third NMOS transistor and a gate of the fourth NMOS transistor are used as the input terminals of the clock mixer. Input terminals of the M current switching units are for receiving the first code, and ground terminals of the M current switching units are grounded.

Preferably, the clock mixer further includes (M+1) tail current providing units, a fifth resistor, a first switch and a second switch. Terminals of M tail current providing units of the (M+1) tail current providing units are connected with the ground terminals of the M current switching units in a one-to-one correspondence way. One terminal of the first switch is connected with the first output terminals of the M current switching units. One terminal of the second switch is connected with the second output terminals of the M current switching units. The other terminal of the first switch, the other terminal of the second switch, one terminal of the fifth resistor and one terminal of the tail current providing unit other than the M tail current providing units of the (M+1) tail current providing units are connected together. The other terminals of the (M+1) tail current providing units are grounded. The other terminal of the fifth resistor is connected with the power supply.

Preferably, the current switching unit includes a fifth NMOS transistor, a sixth NMOS transistor and a seventh NMOS transistor. A drain of the sixth NMOS transistor is used as the first input terminal of each of the M current switching units. A drain of the seventh NMOS transistor is used as the second output terminal of each of the M current switching units. A source of the sixth NMOS transistor, a source of the seventh NMOS transistor and a drain of the fifth NMOS transistor are connected together. A gate of the sixth NMOS transistor and a gate of the seventh NMOS transistor are respectively used as two input terminals of the current switching unit to receive two reverse signals in the first code. A source of the fifth NMOS transistor is grounded, and a gate of the fifth NMOS transistor is for receiving a bias voltage.

Preferably, each of the (M+1) tail current providing units is a current source or a current sink.

Preferably, each of the two multiplexers includes two selection circuits, and each of the two selection circuits may include: N first NMOS transistors, N/2 second NMOS transistors, a third NMOS transistor, and a load element. Sources of every two of the first NMOS transistors are connected together, gates of the every two of the first NMOS transistors are for receiving two phase clocks having a phase difference of 180 degrees respectively, drains of the first NMOS transistors for receiving adjacent phase clocks are connected together, and connection points of the drains of the first NOMS transistors are used as two output terminals of the selection circuit. A drain of each of the second NMOS transistors is connected with a connection point of the sources of the every two of the first NMOS transistors, sources of the N/2 second NMOS transistors are connected together, and gates of the N/2 second NMOS transistors are for receiving the second code. A source of the third NMOS transistor is grounded, a gate of the third NMOS transistor is for receiving a bias voltage, and a drain of the third NMOS transistor is connected with a connection point of the sources of the second NMOS transistors. The load element is connected with the two output terminals of the selection circuit and configured to perform swing limit on received N phase clocks.

Preferably, the load element includes a first resistor and a second resistor. One terminal of the first resistor is connected with one output terminal of the selection circuit. One terminal of the second resistor is connected with the other output terminal of the selection circuit. The other terminal of the first resistor is connected with the other terminal of the second resistor, with a connection point connected with a power supply.

A phase interpolator for a clock and data recovery circuit is provided. The phase interpolator is connected with a control unit of the clock and data recovery circuit, and the phase interpolator includes: an encoding circuit, N clock mixers, and two differential to single-ended amplifiers. An input terminal of the encoding circuit is connected with the control unit, and the encoding circuit is configured to: sample a data control signal outputted by the control unit based on a received parallel clock to generate a sampled signal, sample the sampled signal based on a received sampling clock or a received multi-phase clock group to determine a reference data value, and process the reference data value and a phase control signal outputted by the control unit to generate a first code. A control terminal of each of the N clock mixers is connected with an output terminal of the encoding circuit, and the N clock mixers are configured to receive the first code, and select two phase clocks from received N phase clocks based on the first code and perform a weighting analog operation on the two phase clocks to generate and output a new phase clock, where N is an even number greater than or equal to 4. An input terminal of each of the two differential to single-ended amplifiers is connected with an output terminal of each of the clock mixers, and each of the differential to single-ended amplifiers is configured to amplify a small signal outputted by the clock mixer to a full swing signal.

A clock and data recovery circuit is provided, which includes a phase-locked loop, configured to output N phase clocks, where N is an even number greater than or equal to 4; a control unit, configured to receive a parallel clock and parallel data, generate and output a data control signal and a phase control signal; and the phase interpolator according to any one described above.

Preferably, the clock and data recovery circuit further includes: a receiving circuit and a serial-to-parallel conversion circuit. The receiving circuit is connected with an output terminal of the phase interpolator for the clock and data recovery circuit and configured to receive sampled data and the full swing signal outputted by the phase interpolator for the clock and data recovery circuit. An input terminal of the serial-to-parallel conversion circuit is connected with an output terminal of the receiving circuit and an output terminal of the phase interpolator for the clock and data recovery circuit, and the serial-to-parallel conversion circuit is configured to receive the sampled data and the full swing signal, perform a serial-to-parallel conversion on the sampled data, to generate the parallel clock, the parallel data and a sampling clock or a multi-phase clock group.

In the phase interpolator for the clock and data recovery circuit according to the present disclosure, the encoding circuit is configured to: sample the data control signal outputted by the control unit based on the received parallel clock to generate the sampled signal, sample the sampled signal based on the received sampling clock or the received multi-phase clock group to determines a reference data value, and process the reference data value and the phase control signal outputted by the control unit to generate the first code and the second code; the multiplexer is configured to receive the second code, select two phase clocks from the received N phase clocks based on the second code, and output the selected two phase clocks; the clock mixer is configured to receive the first code, perform the weighting analog operation on the two phase clocks based on the first code to generate and output the new phase clock; and the differential to single-ended amplifier is configured to amplify the small signal outputted by the clock mixer to the full swing signal and provide the full swing signal to the control unit, to determine whether the data sampled in a current clock position is optimal sampled data; and the control unit is configured to further control the encoding circuit to change a delay position for a clock outputted by the phase interpolator in a case that the data sampled in the current clock position is not the optimal sampled data, to lead or lag the clock, thereby forming a stable state in which the clock follows the data dynamically.

BRIEF DESCRIPTION OF THE DRAWINGS

The drawings to be used in the description of embodiments of the disclosure or the conventional technology are described briefly as follows, so that technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

Technical solutions according to embodiments of the present disclosure are described clearly and completely in conjunction with the drawings in the embodiments of the present disclosure hereinafter. Apparently, the described embodiments are only a few rather than all of the embodiments of the present disclosure. Other embodiments obtained by those skilled in the art without any creative work based on the embodiments of the present disclosure fall within the scope of protection of the present disclosure.

A phase interpolator for a clock and data recovery circuit is provided according to the present disclosure, so as to solve a problem in the conventional technology that dynamic performance of the clock and data recovery circuit is poor.

Figure 1:
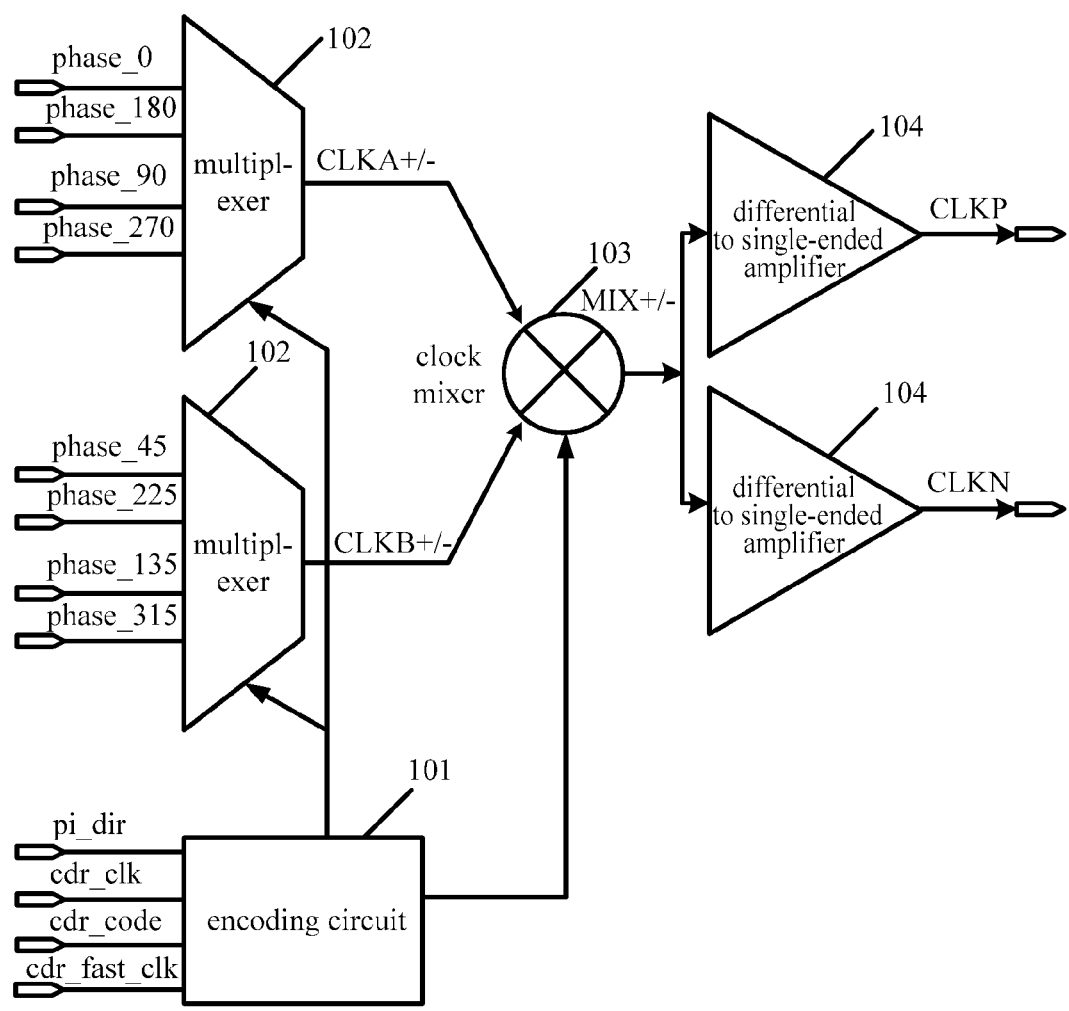
FIG. 1 is a schematic structural diagram of a phase interpolator for a clock and data recovery circuit according to an embodiment of the present disclosure.

Specifically, as shown in FIG. 1, the phase interpolator for the clock and data recovery circuit is connected with a control unit of the clock and data recovery circuit, and the phase interpolator includes: an encoding circuit 101, two multiplexers 102, a clock mixer 103, and two differential to single-ended amplifiers 104. An input terminal of the encoding circuit is connected with the control unit. A control terminal of each of the two multiplexers 102 is connected with an output terminal of the encoding circuit 101. A control terminal of the clock mixer 103 is connected with an output terminal of the encoding circuit 101, input terminals of the clock mixer 103 are connected with output terminals of the two multiplexers 102. An input terminal of each of the two differential to single-ended amplifiers 104 is connected with an output terminal of the clock mixer 103.

The encoding circuit 101 is configured to: sample a data control signal outputted by the control unit based on a received parallel clock to generates a sampled signal, sample the sampled signal based on a received sampling clock or a received multi-phase clock group to determine a reference data value, and process the reference data value and a phase control signal outputted by the control unit to generate a first code and a second code. Each of the two multiplexers 102 is configured to receive the second code, select two phase clocks from received N phase clocks based on the second code, and output the selected two phase clocks, where N is an even number greater than or equal to 4. The clock mixer 103 is configured to receive the first code, perform a weighting analog operation on the received two phase clocks based on the first code to generate and output a new phase clock. Each of the two differential to single-ended amplifier 104 is configured to amplify a small signal outputted by the clock mixer to a full swing signal.

A specific operation flow is described as follows by taking a case that N is equal to 8 as an example. 8 phase clocks received by the two multiplexers 102 are phase_0, phase_180, phase_90, phase_270, phase_45, phase_225, phase_135, and phase_315, respectively.

The encoding circuit 101 is configured to: sample a data control signal cdr_code outputted by the control unit based on a received parallel clock cdr_clk to generate a sampled signal, sample the sampled signal based on a received sampling clock cdr_fast_clk or a received multi-phase clock group cdr_bus_clk<3:0> to determine a reference data value, and process the reference data value and a phase control signal pi_dir outputted by the control unit to generate a first code and a second code.

First, the control unit resets the encoding circuit 101 of the phase interpolator after a system is powered on, so that the encoding circuit 101 transmits a desired second code to control the multiplexer 102 to select two groups of clocks as outputs of the multiplexer 102. In actual application, the second code transmitted by the encoding circuit 101 may be a 8-bit code signal, both one bit of even numbered bits and one bit of odd numbered bits in the second code are high-level signals, the other bits in the second code are low-level signals, and positions of the high-level signals in the second code are adjacent. A control signal encoded into the high-level signal is for switching on a switch, to select, amplify and output two groups of clocks. Two-bit code signals which are high-level signals during reset are preset in advance.

Then, the selected two groups of clock CLKA+/− and CLKB+/− are simultaneously transmitted to the clock mixer 103, to perform weighting, interpolation and mixing. A high-level signal in the first code (the first code may be a 32-bit code signal in an actual application) transmitted to the clock mixer 103 from the encoding circuit 101 during reset is used as a selection signal for a weight. In actual application, a code control signal for one group of clock on which a weighting and interpolation operation is to be performed are a high-level signal, and a code control signal for the other group of clock on which the weighting and interpolation operation is not to be performed are a low-level signal. In this case, the clock mixer 103 is configured to amplify and transmit only one clock signal including all weight information, and the clock mixer 103 is configured to amplify and output a signal MIX+/− to the differential to single-ended amplifiers 104. The differential to single-ended amplifiers 104 are configured to amplify a small signal amplified and outputted by the clock mixer to full swing signals CLKP and CLKN, and transmit the full swing signals CLKP and CLKN to a front-end analog receiving circuit for use. An objective of reset is to ensure that a whole loop of the clock and data recovery circuit operates in a definite state rather than a state in which the loop is disconnected.

After the reset, in a case that the clock signal transmitted by the phase interpolator is received by the receiving circuit, the receiving circuit is configured to sample serial data and convert the serial data into parallel data, and provide the parallel data to the control unit, to determine whether the data sampled in a current clock position is optimal sampled data. In a case that the data sampled in the current clock position is not the optimal sampled data, the control unit is configured to further transmit a signal to control the phase interpolator to change a delay position for a clock, to lead or lag the clock, thereby forming a stable state in which the clock follows the data dynamically.

In the phase interpolator of the clock and data circuit according to the embodiment, the encoding circuit 101 is configured to encode the data control signal and the phase control signal outputted by the control unit into special digital signals (the first code and the second code) required by the multiplexers 102 and the clock mixer 103 in operation. The multiplexers 102 and the clock mixer 103 are controlled to operate seamlessly and collaboratively one after another, to realize smooth transition without mutation. The full swing signals outputted by the differential to single-ended amplifiers 104 may be provided to the control unit to determine whether the data sampled in the current clock position is the optimal sampled data. In a case that the data sampled in the current clock position is not the optimal sampled data, the control unit is configured to further control the encoding circuit 101 to change a delay position for a clock outputted by the phase interpolator, to lead or lag the clock, thereby forming a stable state in which the clock follows the data dynamically.

Preferably, the encoding circuit may include: a first sampling unit, a second sampling unit, a first delay unit, a determination unit, a first operation unit, a second operation unit, a one-hot code logical unit, and a thermometer code logical unit. The first sampling unit is configured to sample the data control signal outputted by the control unit based on the received parallel clock to generate a sampled signal. The second sampling unit is configured to sample the sampled signal based on the received sampling clock or the received multi-phase clock group to determine the reference data value. The first delay unit is configured to delay highest three bits of the reference data value for two cycles of the parallel clock to obtain a highest-three-bit delay value. The determination unit, configured to perform logical processing on the highest three bits of the reference data value and the highest-three-bit delay value to determine whether cross-quadrant occurs. The first operation unit, configured to perform a logical operation on lower four bits of the reference data value based on a determination result of the determination unit to obtain a lower-four-bit operation value. The second operation unit, configured to obtain a lowest-bit operation value based on the determination result of the determination unit and the phase control signal outputted by the control unit. The one-hot code logical unit, configured to perform one-hot code logical processing on the highest-three-bit delay value to generate the second code. The thermometer code logical unit, configured to perform thermometer code logical processing on the lower-four-bit operation value and the lowest-bit operation value to generate the first code, where the lowest bit of the first code is generated by separately encoding the lowest-bit operation value.

Preferably, in a case that the determination result of the determination unit is that cross-quadrant occurs, the first operation unit and the second operation unit are configured to transfer all weights to a side of a bordering phase to change a phase once, the one-hot code logical unit is configured to change a phase of the second code, and the thermometer code logical unit is configured to change a phase of the first code.

A specific operation principle is described as follows. The highest three bits of the reference data value cdr_code<6:0> outputted by the control unit are encoded into the second code mux_sel<7:0> for the multiplexers to select two groups of inputted clock signals to participate in mixing. The lower four bits of the reference data value cdr_code<6:0> are encoded into the first code mix_sel<15:0> for the clock mixer (mix_sel_<15:0> is a reverse signal) to generate a new phase clock.

It should be noted that, a code value in the lowest bit mix_sel<0> (mix_sel_b<0> is a reverse signal) of the first code is encoded separately since the code value affects not only an encoding speed but also smooth transition of a clock quadrant. An additional control signal is required when the code value is encoded, and the additional control signal is a phase control signal pi_dir indicating whether the phase is leaded or lagged. The code value of the lowest bit mix_sel<0> of the first code is encoded based on the phase control signal pi_dir and an indicator of a current quadrant.

Concerning a correspondence between the reference data value cdr_code<6:0>, the second code mux_sel<7:0> and the first code mix_sel<15:0>, reference is made to Table 1.

TABLE 1

Correspondence between reference data value, second code and first code

| cdr_code<6:0> | mux_sel<7:0> | mix_sel<15:0> |
|---|---|---|
| 000 0000 | 0000 0011 | 0000 0000 0000 0000 |
| 000 0001 | 0000 0011 | 0000 0000 0000 0010 |
| 000 0010 | 0000 0011 | 0000 0000 0000 0110 |
| 000 0011 | 0000 0011 | 0000 0000 0000 1110 |
| ⋮ | ⋮ | ⋮ |
| 000 1100 | 0000 0011 | 0001 1111 1111 1110 |
| 000 1101 | 0000 0011 | 0011 1111 1111 1110 |
| 000 1110 | 0000 0011 | 0111 1111 1111 1110 |
| 000 1111 | 0000 0011 | 1111 1111 1111 1110 |
| 001 0000 | 0000 0011 | 1111 1111 1111 1111 |
| 001 0000 | 0000 0110 | 1111 1111 1111 1111 |
| 001 0000 | 0000 0110 | 1111 1111 1111 1111 |
| 001 0001 | 0000 0110 | 0111 1111 1111 1111 |

TABLE 1-continued

Correspondence between reference data value, second code and first code

| cdr_code<6:0> | mux_sel<7:0> | mix_sel<15:0> |
|---|---|---|
| 001 0010 | 0000 0110 | 0011 1111 1111 1111 |
| 001 0011 | 0000 0110 | 0001 1111 1111 1111 |
| \| | \| | \| |
| 001 1100 | 0000 0110 | 0000 0000 0000 1111 |
| 001 1101 | 0000 0110 | 0000 0000 0000 0111 |
| 001 1110 | 0000 0110 | 0000 0000 0000 0011 |
| 001 1111 | 0000 0110 | 0000 0000 0000 0001 |

The first code mix_sel<15:0> and mix_sel_b<15:0> can be exchanged based on a value of the weight of the clock mixer without recoding, which falls within the scope of protection of the present disclosure.

Figure 2:
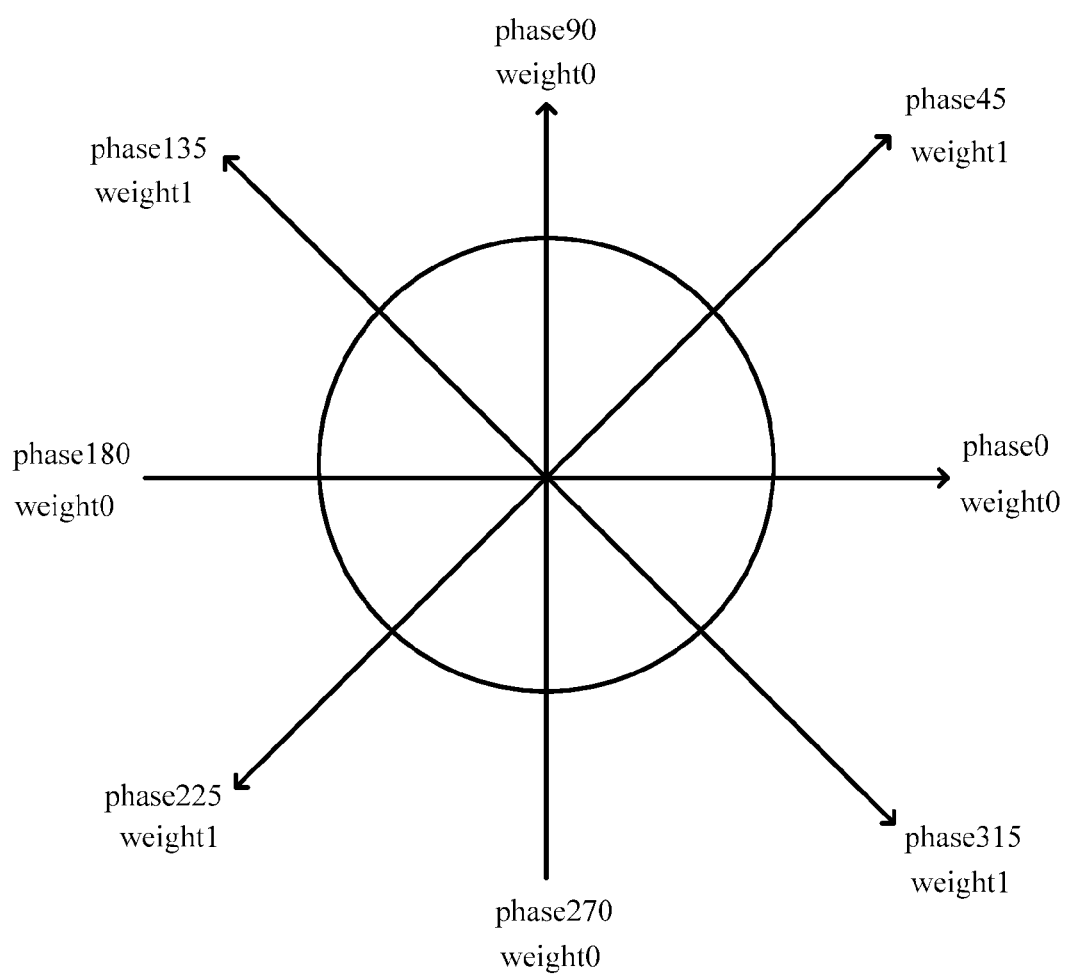
FIG. 2 is a schematic diagram of a correspondence between a phase clock and a weight according to an embodiment of the present disclosure.

FIG. 2 shows a correspondence between N phase clocks and weights. A special processing is required at a location where a phase crosses over a quadrant in a case that the determination result of the determination unit is that cross-quadrant occurs. First, all of the weights are transferred to a side of a bordering phase to change a phase once. Then the multiplexer is changed to exchange the phase, in this case, all of the weights are located in the bordering phase in a previous step rather than in the present phase, the phase is substantially invariant. Finally, the clock mixer is changed to realize phase jump, and the phase is changed once. It can be seen that, the phase is changed twice at the location where the phase crosses over the quadrant, and a response speed of the phase interpolator is not affected substantially. In a whole clock and data recovery circuit process, an encoding part of the phase interpolator realizes a delay for only additional one cycle and a bandwidth of the clock and data recovery circuit is not dissipated substantially.

Figure 3:
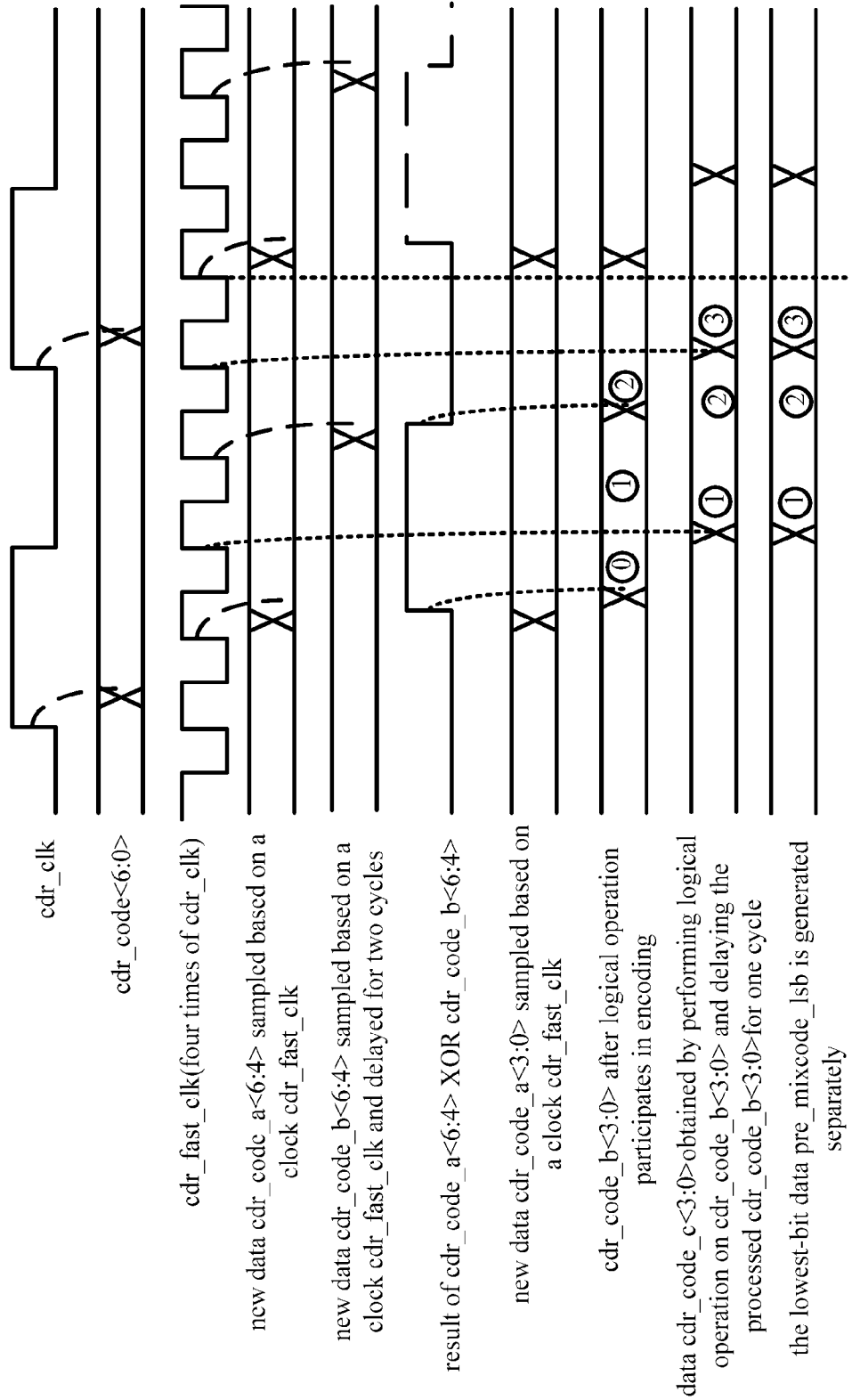
FIG. 3 is a sequence diagram of data in an encoding circuit according to an embodiment of the present disclosure.

FIG. 3 shows a sequence diagram for realizing an encoding algorithm described above. The phase interpolator is configured to resample the data control signal cdr_code<6:0> and the phase control signal pi_dir transmitted by the control unit after receiving the parallel clock cdr_clk and the sampling fast clock cdr_fast_clk or the multi-phase clock group cdr_bus_clk<3:0>. The phase interpolator is configured to sample data is sampled by using the parallel clock cdr_clk to ensure that interface timing is correct, and then resample the data sampled based on the parallel clock by using the sampling fast clock cdr_fast_clk or the multi-phase clock group cdr_bus_clk<3:0>. In this way, a reference point (the reference data value) in a fast clock domain is determined, and logical encoding is performed on the reference data value based on the data control signal cdr_code<6:0> and the phase control signal pi_dir. First, highest three bits cdr_code_a<6:4> of the reference data value are delayed for two cycles to obtain a highest-three-bit delay value cdr_code_b<6:4>; and it is determined whether a phase represented by a current binary code crosses over a quadrant (cross-quadrant) by performing a simple exclusive OR logic operation on the highest-three-bit delay value cdr_code_b<6:4> and highest three bits cdr_code_a<6:4> of the reference data value. Next, logical operation is performed on lower four bits cdr_code_a<3:0> of the reference data value based on a signal for the determination result to obtain cdr_code_b<3:0>, and logical operation is further performed to obtain a lower-four-bit operation value cdr_code_c<3:0>. Data pre_mixcode_lsb is regenerated based on the signal for the determination result and the phase control signal pi_dir. The highest-three-bit delay value cdr_code_b<6:4>, the lower-four-bit operation value cdr_code_c<3:0> and pre_mixcode_lsb are transmitted to a core encoding circuit (the one-hot code logical unit and the thermometer code logical unit) to be encoded, to obtain final encoded values mux_sel<7:0>, mix_sel<15:0> and mix_sel_b<15:0>. All the circuit logic should be completed during a time period from a delay included in the encoding circuit to a clock edge indicated by a dotted line at the far right of the FIG. 3. A trigger is required in a case that the time period is not enough for the circuit logic, and the clock is changed with the trigger, which depends on an actual application environment, and all falls within the scope of protection of the present disclosure.

It should be noted that, the sampling fast clock cdr_fast_clk can be replaced with the multi-phase clock group cdr_bus_clk<N:0> having a same frequency as the parallel clock cdr_clk in a case that the sampling fast clock cdr_fast_clk is N times as fast as the parallel clock cdr_clk. A cdr_bus_clk<N−1:0> is also available if the parallel clock cdr_clk is used, which all falls within the scope of protection of the present disclosure.

Processing is performed in a no-cross-quadrant way in a case of no-cross-quadrant; and processing is performed in a cross-quadrant way in a case of cross-quadrant. In three cross-quadrant states of ④, ②, ③ in FIG. 3, values of key data cdr_code_b<3:0>, cdr_code_c<3:0> and pre_mixcode_lsb are shown in Table 2 and Table 3.

TABLE 2

| | Value of key data | | |
|---|---|---|---|
| value | ⓪ | ① | ② |
| cdr_code_a<4> = 0, cdr_code_b<3:0>= | cdr_code_a<3:0> | cdr_code_a<3:0> | cdr_code_a<3:0> |
| cdr_code_a<4> = 1, cdr_code_b<3:0>= | radix-minus-one complement of cdr_code_a<3:0> | radix-minus-one complement of cdr_code_a<3:0> | radix-minus-one complement of cdr_code_a<3:0> |

TABLE 3

| | Value of key data | | |
|---|---|---|---|
| value in a case of cross-quadrant | ① | ② | ③ |
| cdr_code_c<3:0>= | cdr_code_a<4> XNOR pi_dir | cdr_code_a<4> XNOR pi_dir | cdr_code_b<3:0> |
| pre_mixcode_lsb= | cdr_code_a<4> XNOR pi_dir | cdr_code_a<4> XNOR pi_dir | cdr_code_a<4> |

Preferably, the data control signal and the phase control signal outputted by the control unit are binary encoded.

In a case that both the data control signal and the phase control signal are binary encoded, a bandwidth can not be reduced, and an available code value is generated after the data control signal and the phase control signal pass through the encoding circuit of the phase interpolator.

Figure 4:
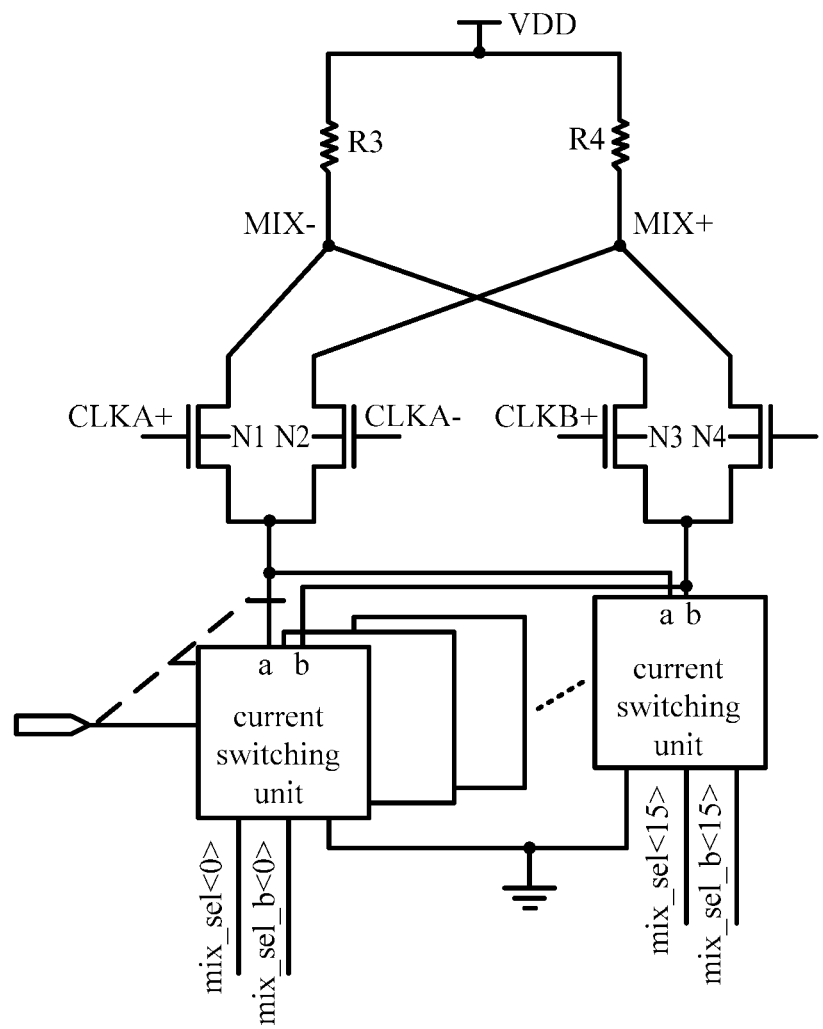
FIG. 4 is a schematic structural diagram of a clock mixer according to an embodiment of the present disclosure.

Preferably, as shown in FIG. 4, the clock mixer includes M current switching units, a third resistor R3, a fourth resistor R4, a first NMOS transistor N1, a second NMOS transistor N2, a third NMOS transistor N3 and a fourth NMOS transistor N4, where M is a natural number greater than 1. Both one terminal of the third resistor R3 and one terminal of the fourth resistor R4 are connected with a power supply VDD. The other terminal of the third resistor R3, a drain of the first NMOS transistor N1 and a drain of the third NMOS transistor N3 are connected together, with a connection point acting as an output terminal of the clock mixer. The other terminal of the fourth resistor R4, a drain of the second NMOS transistor N2 and a drain of the fourth NMOS transistor N4 are connected together, with a connection point acting as another output terminal of the clock mixer. A source of the first NMOS transistor N1 is connected with a source of the second NMOS transistor N2, with a connection point connected with first output terminals a of the M current switching units. A source of the third NMOS transistor N3 is connected with a source of the fourth NMOS transistor N4, with a connection point connected with second output terminals b of the M current switching units. A gate of the first NMOS transistor N1, a gate of the second NMOS transistor N2, a gate of the third NMOS transistor N3 and a gate of the fourth NMOS transistor N4 are used as the input terminals of the clock mixer. Input terminals of the M current switching units are for receiving the first code, and ground terminals of the M current switching units are grounded.

Drains of gain tubes (the first NMOS transistor N1 and the third NMOS transistor N3) respectively connected with CLKA+ and CLKB+ in two groups of clocks outputted by the multiplexers are connected together to output MIX−, drains of gain tubes (the second NMOS transistor N2 and the fourth NMOS transistor N4) respectively connected with CLKA− and CLKB− are connected together to output MIX+, and a load element (the third resistor R3 or a fourth resistor R4) is shared among the drains of the gain tubes. In this case, it is ensured that a delay time period of the clock on which weighting, interpolation and mixing is performed is changed gradually, and a node connected with the load elements is an output node of the clock mixer.

The gain tubes are connected with the current switching units which represent weights, control signals (the first code) connected with the current switching units comes from the encoding circuit. Each of the current switching units has two control signals which are mutually exclusive (for example, mix_sel<0> and mix_sel_b<0>, or mix_sel<15> and mix_sel_b<15>). In this way, it is ensured that a sum of the current flowing through the current switching units is a fixed current. A proportion of the current in the fixed current flowing through a gain tube indicates a weight of a clock corresponding to the gain tube. In a case that the control signal (the first code) outputted by the encoding circuit is changed, a weight proportion of two groups of clocks is changed, and the delay time for the outputted clock of the clock mixer is changed accordingly, thereby completing a weighting and interpolation process.

The current switching units are shown in FIG. 4 by taking a case that the number of the current switching units is 16 as an example, and the number of control signals for controlling the current switching units is 32. The number of current switching units may also be another value, such as a natural number greater than 1. In practice, the number of the current switching units has a limit depending on an application environment.

Figure 5:
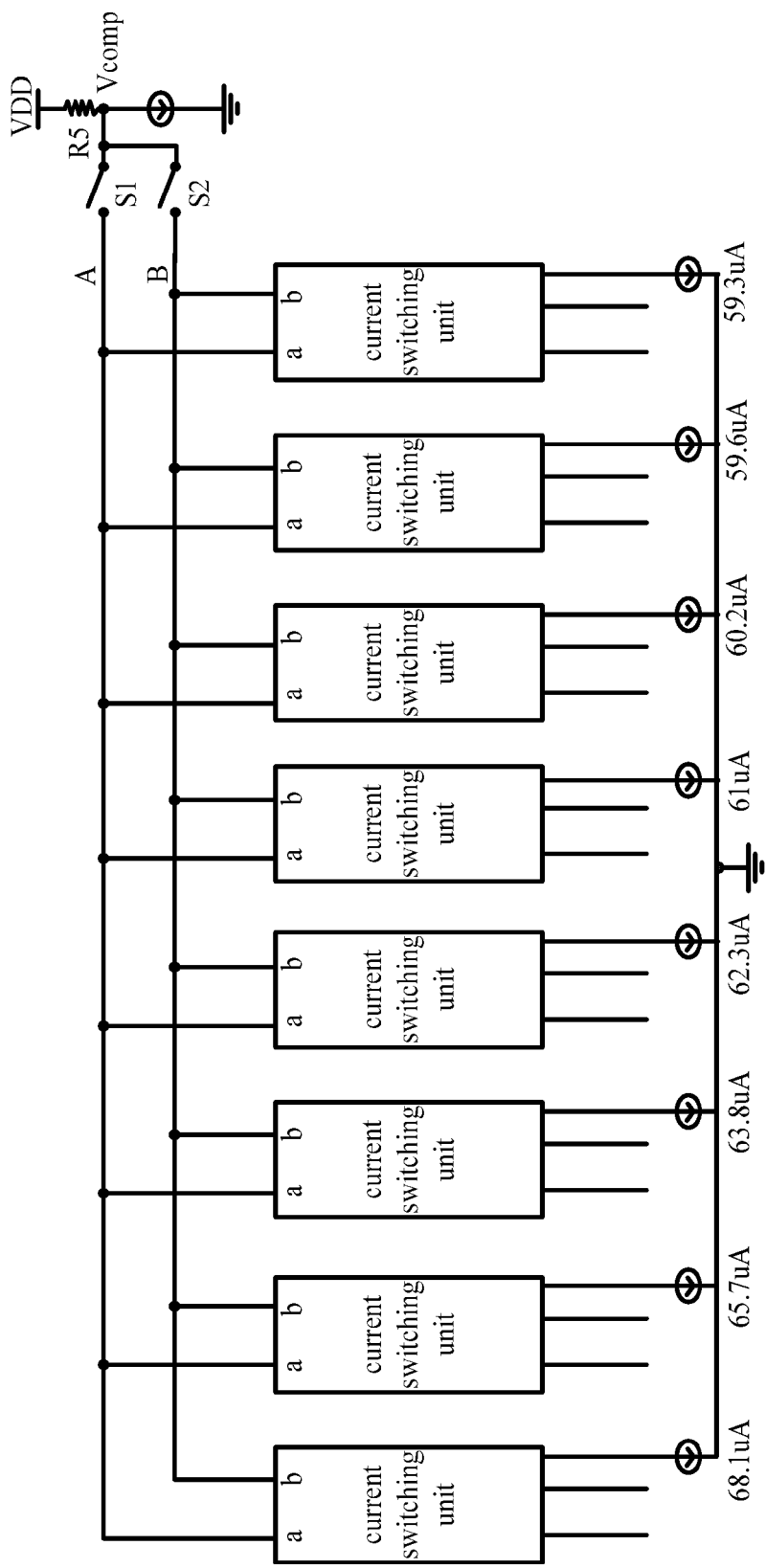
FIG. 5 is a schematic structural diagram of another clock mixer according to an embodiment of the present disclosure.

Optionally, as shown in FIG. 5, the clock mixer further includes (M+1) tail current providing units, a fifth resistor R5, a first switch S1 and a second switch S2. Terminals of M tail current providing units of the (M+1) tail current providing units are connected with the ground terminals of the M current switching units in a one-to-one correspondence way. One terminal of the first switch S1 is connected with the first output terminals a of the M current switching units. One terminal of the second switch S2 is connected with the second output terminals b of the M current switching units. The other terminal of the first switch S1, the other terminal of the second switch S2, one terminal of the fifth resistor R5 and one terminal of the tail current providing unit other than the M tail current providing units of the (M+1) tail current providing units are connected together. The other terminals of the (M+1) tail current providing units are grounded. The other terminal of the fifth resistor R5 is connected with the power supply VDD.

Figure 6:
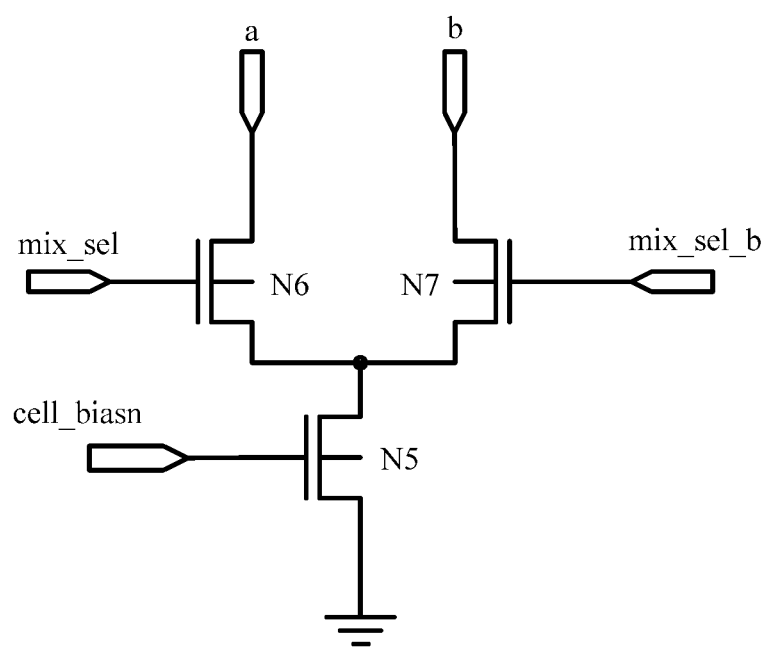
FIG. 6 is a schematic structural diagram of a current switching unit according to an embodiment of the present disclosure.

Preferably, as shown in FIG. 6, the current switching unit shown in FIG. 4 and FIG. 5 includes a fifth NMOS transistor N5, a sixth NMOS transistor N6 and a seventh NMOS transistor N7. A drain of the sixth NMOS transistor N6 is used as the first output terminal a of the current switching unit. A drain of the seventh NMOS transistor N7 is used as the second output terminal b of the current switching unit. A source of the sixth NMOS transistor N6, a source of the seventh NMOS transistor N7 and a drain of the fifth NMOS transistor N5 are connected together. A gate of the sixth NMOS transistor N6 and a gate of the seventh NMOS transistor N7 are respectively used as two input terminals of the current switching unit to receive two reverse signals in the first code. A source of the fifth NMOS transistor N5 is grounded, and a gate of the fifth NMOS transistor N5 is for receiving a bias voltage.

A circuit of the current switching unit shown in FIG. 6 includes three NMOS transistors (the fifth NMOS transistor N5, the sixth NMOS transistor N6 and the seventh NMOS transistor N7). The fifth NMOS transistor N5 is a current tube for providing a weighting current, the sixth NMOS transistor N6 and the seventh NMOS transistor N7 are switch switching tubes for switching a current direction of the current tube. For the circuit, in a case that a pair of mutually-exclusive control signals are transmitted by the encoding circuit, for example, mix_sel is a high-level signal, and mix_sel_b is a low-level signal, the sixth NMOS transistor N6 is switched on, and the seventh NMOS transistor N7 is switched off. A weight of a clock corresponding to the sixth NMOS transistor N6 is added by one, and a weight of a clock corresponding to the seventh NMOS transistor N7 is reduced by one, which results in that a position of an outputted clock of the phase interpolator moves towards a clock corresponding to the sixth NMOS transistor N6, that is, the position of the outputted clock is leaded, whereas, the position of the outputted clock is lagged. A reference clock selected here is invariable.

The clock mixer shown in FIG. 5 includes the current switching units shown in FIG. 6. In this way, the linearity of the phase interpolator can be improved effectively, and the conventional weighting and mixing method for a linear current is modified, the linearity of the phase interpolator can be further improved by using a weighting and mixing method for a non-linear current. An objective to reduce jitter between cycles is achieved, thereby reducing a bit error rate, and improving the performance of the adaptive equalization technology based on the phase interpolator.

For the phase interpolator, normalized weights are indicated by $A_1$ and $A_2$, two phase clocks to be mixed are indicated by $\sin(\omega T)$ and $\sin(\omega T-\phi_d)$, and the mixed clock is as follows.

$$CLK_{PI}=A_1 \sin(\omega T)+A_2 \sin(\omega T-\phi_d)=\sqrt{p^2+q^2} \sin(\omega T-\phi_{PI})$$

where $p=A_1+A_2 \cos \phi_d$, $q=A_2 \sin \phi_d$, $\tan \phi_{PI}=q/p$

Assuming $\phi_d=45°$, in a case that $\phi_d$ is divided into 16 parts equally, a value of $\tan \phi_{PI}$ ranges from 0 to $\tan((45°/16)*(16-\alpha))$, inclusively, where $\alpha \in [0,16]$. Values of the weights $A_1$ and $A_2$ after linear compensation are obtained in conjunction with $A_1+A_2=1$, the normalized weights are converted into a current required by each of the current switching units based on a total current used actually, and the current values compensated after calculation are symmetrical (a final computed value given in FIG. 5 has a maximum current of 1 mA).

With the clock mixer shown in FIG. 5, a charge charging compensation method for further improving linearity is further provided. The principle thereof is described as follows. One group of the inputted clock signal has all the weights and the other group of the inputted clock signal has no weight in a case that all currents in the current switching units flow into one of two inputted clock signals. In this case, the inputted clock signal having no weight may interfere with output in a process that all the weights become zero. This is because that a potential of an output node is reduced in a case that the first NMOS transistor N1 and the second NMOS transistor N2 (or the third NMOS transistor N3 and the fourth NMOS transistor N4) shown in FIG. 4 operate from a saturation region to a linear region suddenly, and a final output is affected. In a process that all the weights become zero, the first switch S1 (or the second switch S2) is switched on, the second switch S2 (or the first switch S1) is switched off, so that a node Vcomp charges a node A (B). A voltage of the node Vcomp is generally set to be less than a minimum signal voltage of the output node. In this way, a potential of the node A (B) can be compensated. Hence, the problem of channel leakage of the first NMOS transistor N1 and the second NMOS transistor N2 (or the third NMOS transistor N3 and the fourth NMOS transistor N4) is solved, thereby further improving the linearity.

Preferably, each of the (M+1) tail current providing unit may be a current source or a current sink.

In an actual application, a current provided by each of the tail current providing units are not limited, and values of currents received by the multiple current switching units may be 68.1 uA, 65.7 uA, 63.8 uA, 62.3 uA, 61 uA, 60.2 uA, 59.6 uA, 59.3 uA and so on in turn, which are not described here, depending on an application environment.

Figure 7:
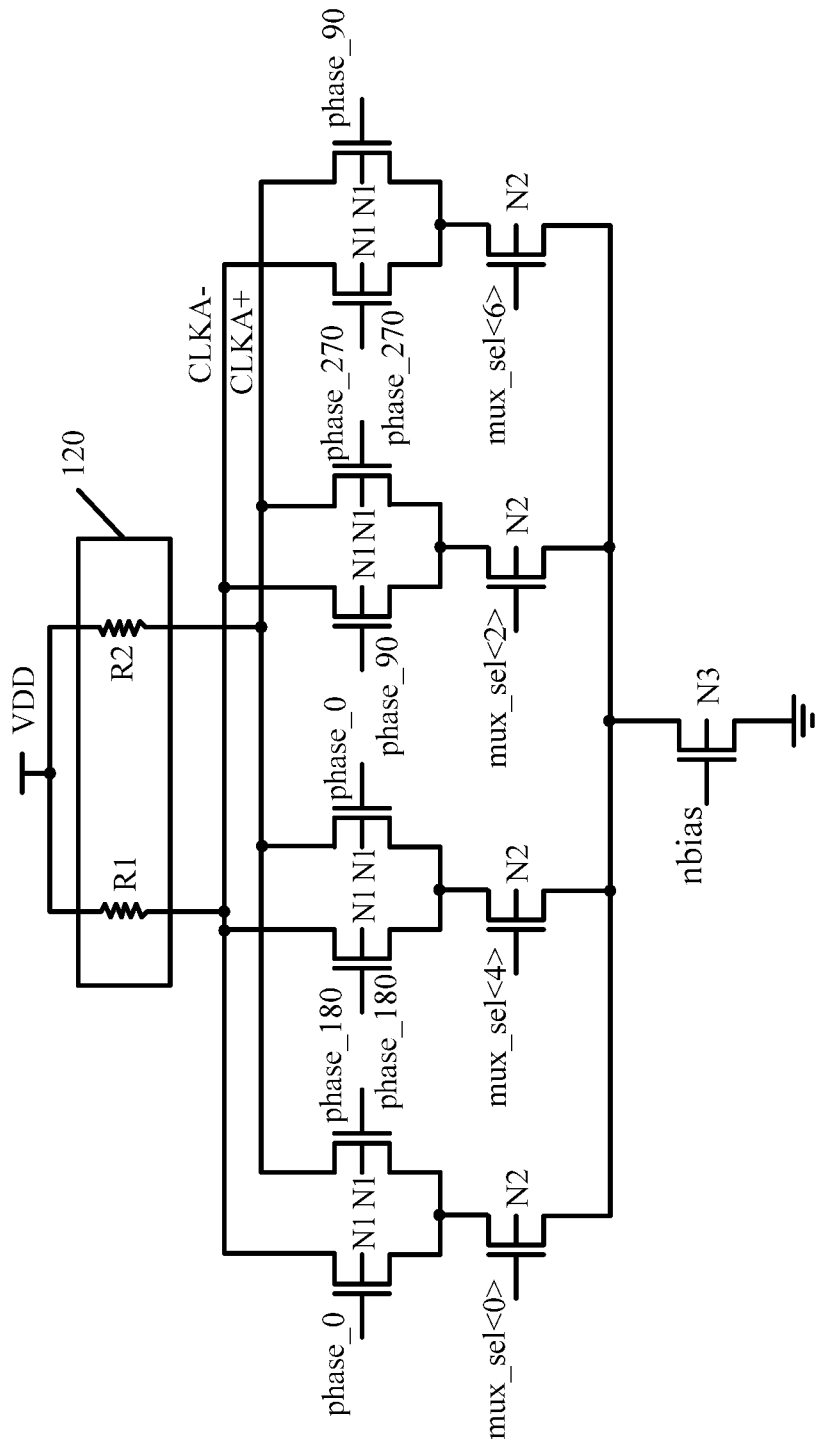
FIG. 7 is a schematic structural diagram of a multiplexer according to an embodiment of the present disclosure.

Preferably, the multiplexer 102 includes two selection circuits, as shown in FIG. 7, each of the selection circuits includes: N first NMOS transistors N1, N/2 second NMOS transistors N2, a third NMOS transistor N3, and a load element 120. Sources of every two of the first NMOS transistors N1 are connected together, gates of the every two of the first NMOS transistors are for receiving two phase clocks having a phase difference of 180 degrees respectively, drains of the first NMOS transistors for receiving adjacent phase clocks are connected together, and connection points of the drains of the first NOMS transistors are used as two output terminals of the selection circuit. A drain of each of the second NMOS transistors N2 is connected with a connection point of the sources of the every two of the first NMOS transistors N1, sources of the N/2 second NMOS transistors N2 are connected together, and gates of the N/2 second NMOS transistors N2 are for receiving the second code. A source of the third NMOS transistor N3 is grounded, a gate of the third NMOS transistor N3 is for receiving a bias voltage, and a drain of the third NMOS transistor N3 is connected with a connection point of the sources of the second NMOS transistors N2. The load element 120 is connected with two output terminals of the selection circuit and configured to perform swing limit on received N phase clocks.

Preferably, as shown in FIG. 7, the load element 120 includes a first resistor R1 and a second resistor R2. One terminal of the first resistor R1 is connected with one output terminal of the selection circuit. One terminal of the second resistor R2 is connected with the other output terminal of the selection circuit. The other terminal of the first resistor R1 is connected with the other terminal of the second resistor R2, with a connection point connected with a power supply VDD.

A multi-phase clock inputted into the two multiplexers 102 is illustrated by taking 8 clocks of phase_0, phase_180, phase_45, phase_225, phase_90, phase_270, phase_135 and phase_315 as an example. FIG. 7 shows only one multiplexer of the multiplexers 102 which is configured to receive phase_0, phase_180, phase_90, phase_270, mux_sel<0>, mux_sel<2>, mux_sel<4> and mux_sel<6>. The other multiplexer of the multiplexer 102 is configured to receive phase_45, phase_225, phase_135, phase_315, mux_sel<1>, mux_sel<3>, mux_sel<5> and mux_sel<7>, and has a same structure in FIG. 7, which is not described repeatedly here.

In the code signal transmitted by the encoding circuit during reset, only mux_sel<1> and mux_sel<0> are high-level signals, each of mux_sel<7:2> is a low-level signal. In a case that the code signal is inputted into the multiplexers 102, the second NMOS transistor N2 for receiving mux_sel<1> or mux_sel<0> shown in FIG. 7 is switched on, and phase_0/phase_180, phase_45/phase_225 are amplified and outputted by the multiplexers. nbias in FIG. 7 is a bias voltage.

The load element 120 is configured to limit the inputted multi-phase clock within a certain swing range after the inputted multi-phase clock passes through the multiplexer 102. In a case that a RC time constant of an output node between the multiplexer 102 and the clock mixer 103 is changed appropriately, the multi-phase clock is transmitted to the clock mixer 103 to realize phase interpolation in a wide frequency range (100 M to 2 GHz).

The load element 120 is composed of first resistor R1 and the second resistor R2, which can limit the inputted multi-phase clock within a certain swing range after the inputted multi-phase clock passes through the multiplexer, and can be applied into a high speed. All of the second NMOS transistors N2 are switching tubes, and all of the first NMOS transistors N1 are gain tubes. As shown in FIG. 7, a case that the switching tube is arranged below the gain tube is taken as an example. In an actual application, the switching tube may also be arranged above the gain tube. An advantage of this case is that Miller effect of the gain tube is reduced, that is, an feedback effect of the outputted signal on the inputted signal is reduced. The described above all fall within the scope of the protection of the present disclosure.

The multi-phase clock input given in the embodiment includes 8 clocks, and the number of the control signals is 8. The number of the multi-phase clock input may be other number, may be an even number greater than or equal to 4, for example, 4, 6, 8 . . . N. A method for connecting the multi-phase clock input used is special in a case that N/2 is an odd number, which falls within the scope of protection of the present disclosure.

An embodiment of the present disclosure further provides another phase interpolator for a clock and data recovery circuit. The phase interpolator is connected with a control unit of the clock and data recovery circuit, and the phase interpolator includes: an encoding circuit, N clock mixers, and two differential to single-ended amplifiers. An input terminal of the encoding circuit is connected with the control unit, and the encoding circuit is configured to: sample a data control signal outputted by the control unit based on a received parallel clock to generate a sampled signal, sample the sampled signal based on a received sampling clock or a received multi-phase clock group to determine a reference data value, and process the reference data value and a phase control signal outputted by the control unit to generate a first code. A control terminal of each of the N clock mixers is connected with an output terminal of the encoding circuit, and the N clock mixers are configured to receive the first code, and select two phase clocks from received N phase clocks and perform a weighting analog operation on the two phase clocks based on the first code to generate and output a new phase clock, where N is an even number greater than or equal to 4. An input terminal of each of the two differential to single-ended amplifiers is connected with output terminals of the clock mixers, and each of the two differential to single-ended amplifiers is configured to amplify a small signal outputted by each of the clock mixers to a full swing signal.

This embodiment differs from the embodiment described above in that, the multiplexer in the embodiment described above is omitted, multiple clock mixers are used to replace the multiplexer in this embodiment. N clock mixers have a function of the multiplexer, and are applicable at a low operation frequency, but the cost is an increased area. The multiplexer is used in the embodiment described above, which is applicable at a high operation frequency, thereby saving an area of the phase interpolator, improving the linearity and broadening a frequency range of application. Both this embodiment and the embodiment described above fall within the scope of protection of the present disclosure, which is not limited here.

Both the encoding circuit and the clock mixer can be realized in a form according to the embodiment described above, which is not described repeatedly here.

Figure 8:
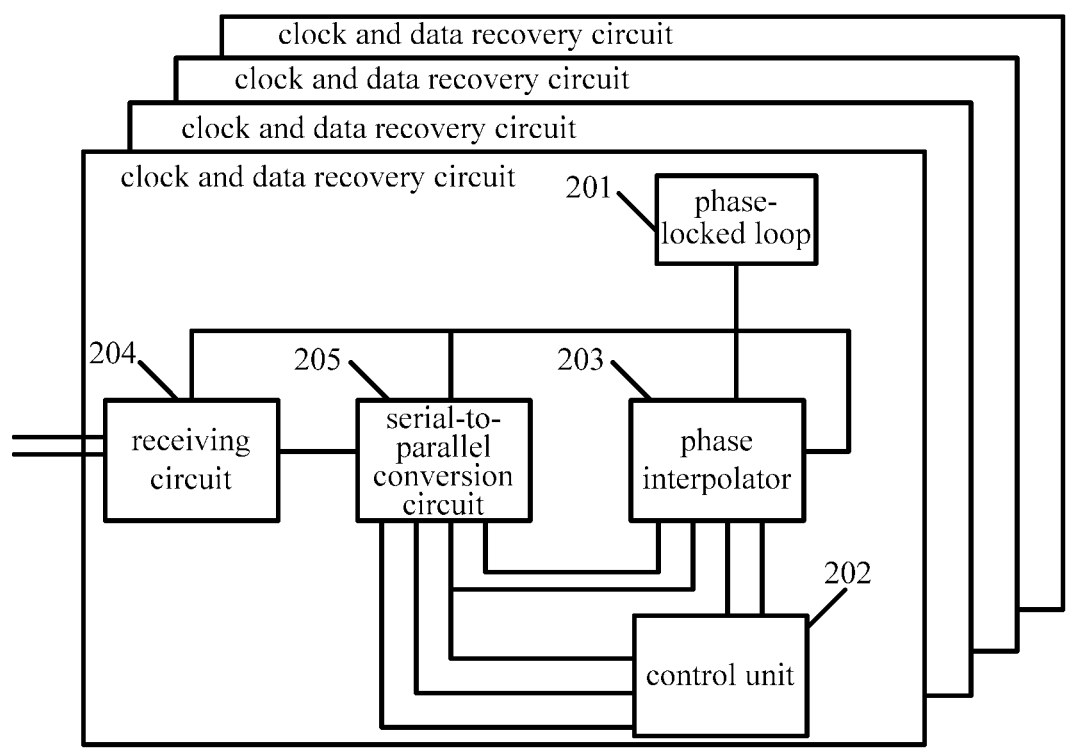
FIG. 8 is a schematic structural diagram of a clock and data recovery circuit according to an embodiment of the present disclosure.

An embodiment of the present disclosure further provides a clock and data recovery circuit. As shown in FIG. 8, the clock and data recovery includes: a phase-locked loop 201, a control unit 202 and the phase interpolator 203 of the clock and data recovery circuit according to any one of the embodiments described above. The phase-locked loop 201 is configured to output N phase clocks, where N is an even number greater than or equal to 4. The control unit 202 is configured to receive a parallel clock and parallel data, and generate and output a data control signal and a phase control signal. The phase interpolator 203 of the clock and data recovery circuit has a same structure and principle as the phase interpolator for the clock and data recovery circuit according to the embodiments described above, which is not described repeatedly here.

Preferably, as shown in FIG. 8, the clock and data recovery circuit further includes: a receiving circuit 204, and a serial-to-parallel conversion circuit 205. The receiving circuit 204 is connected with an output terminal of the phase interpolator 203 of the clock and data recovery circuit, and is configured to receive sampled data and a full swing signal outputted by the phase interpolator for the clock and data recovery circuit. An input terminal of the serial-to-parallel conversion circuit 205 is connected with an output terminal of the receiving circuit 204 and an output terminal of the phase interpolator 203 of the clock and data recovery circuit. The serial-to-parallel conversion circuit 205 is configured to receive the sampled data and the full swing signal, perform a serial-to-parallel conversion on the sampled data, to generate the parallel clock, the parallel data and a sampling clock or a multi-phase clock group.

A specific structure and operation principle are the same as the structure and the operation principle in the embodiments described above, which are not described here.

A multi-channel transmission system having a same source has a same clock having a proportional relation with a data rate in a transmission process. In this case, it is required to only consider an instantaneous position offset between the clock and the data in a clock and data recovery process at the receiving terminal. The phase interpolator which mixes the phase of the clock can change a phase position of the clock constantly, to correct an offset distance between the clock and the data, thereby achieving an objective to sample the data at an optimal position.

A multi-channel transmission system having different sources does not have a same clock having a proportional relation with a data rate in the transmission process. In this case, it is required to not only consider an instantaneous position offset between the clock and the data in a clock and data recovery process at the receiving terminal, but also consider an influence of long-time frequency offset. A high-speed phase interpolator can change a phase position of the clock in a real-time manner, to correct an offset distance between the clock and the data, thereby achieving the objective to sample the data at the optimal position. In a loop of the clock and data recovery circuit, a control unit of the clock and data recovery circuit, as a determination and control center of the whole loop, is configured to control the phase interpolator to adjust a control signal for the phase. As the number of data channels and the number of mixed phases increase, the control signal becomes complex, which brings difficulty to subsequent layout design, and requires more wiring area since it is difficult to control time sequence.

The clock and data recovery circuit according to the present disclosure is applicable to a multi-channel transmission system having different sources. With the encoding circuit invented for the complex control signal, the difficulty of subsequent layout design can be reduced, it is easy to control the time sequence, and the cost is reduced. Also, a complex quadrant boundary control unit configured to detect a problem of cross-boundary is not required, a defect of phase jump is avoided, and smooth transition for the quadrant is realized. The encoding circuit uses a high speed clock or a multi-phase clock to realize fast encoding. In this case, a jump speed of the phase interpolator is improved significantly, and although the phase interpolator has a delay of one operation logical clock in the whole clock and data recovery circuit loop, a bandwidth of the whole clock and data recovery circuit loop is greatly improved, and the capability of frequency tracking is improved accordingly. A frequency offset tracking index which is in a range of about plus or minus 6000 ppm can be met according to the present disclosure. Theoretically, a frequency offset tracking index which is in a range of about plus or minus 12000 ppm frequency offset can be met in maximum, which realizes any maximum jump span about 40 degrees in one parallel clock cycle.

In addition, in the current switching unit issued for the typical non-linearity of the phase interpolator, the linearity of the phase interpolator and a switching speed of the current can be improved effectively. The conventional weighting and mixing method for the linear current is modified, and the weighting and mixing method for the non-linear current is used to further improve the linearity of the phase interpolator. The objective to reduce jitter between cycles is achieved, the bit error rate is reduced accordingly, and the performance of adaptive equalization technology based on the phase interpolator is improved.

The embodiments of the specification are described in a progressive manner, with the emphasis of each of the embodiments on the difference from the other embodiments. Hence, for the same or similar parts between the embodiments, one embodiment can be understood with reference to the other embodiments.

The description of the embodiments herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure may not be limited to the embodiments described herein, but is in accordance with the widest scope consistent with the principles and novel features disclosed herein.

The invention claimed is:

1. A phase interpolator for a clock and data recovery circuit, wherein the phase interpolator is connected with a controller of the clock and data recovery circuit, and the phase interpolator comprises:
    an encoding circuit, wherein an input terminal of the encoding circuit is connected with the controller, and the encoding circuit is configured to: sample a data control signal outputted by the controller based on a received parallel clock to generate a sampled signal, sample the sampled signal based on a received sampling clock or a received multi-phase clock group to determine a reference data value, and process the reference data value and a phase control signal outputted by the controller to generate a first code and a second code;
    two multiplexers, wherein a control terminal of each of the two multiplexers is connected with an output terminal of the encoding circuit, and each of the two multiplexers is configured to receive the second code, select two phase clocks from received N phase clocks based on the second code, and output the selected two phase clocks, where N is an even number greater than or equal to 4;
    a clock mixer, wherein a control terminal of the clock mixer is connected with an output terminal of the encoding circuit, input terminals of the clock mixer is connected with output terminals of the two multiplexers, the clock mixer is configured to receive the first code, perform a weighting analog operation on the received two phase clocks based on the first code to generate and output a new phase clock; and
    two differential to single-ended amplifiers, wherein an input terminal of each of the two differential to single-ended amplifiers is connected with an output terminal of the clock mixer, and each of the two differential to single-ended amplifiers is configured to amplify a small signal outputted by the clock mixer to a full swing signal.

2. The phase interpolator according to claim 1, wherein the encoding circuit comprises:
    a first sampler, configured to sample the data control signal outputted by the controller based on the received parallel clock to generate a sampled signal;
    a second sampler, configured to sample the sampled signal based on the received sampling clock or the received multi-phase clock group to determine the reference data value;
    a first delay, configured to delay highest three bits of the reference data value for two cycles of the parallel clock to obtain a highest-three-bit delay value;
    a logic circuit, configured to perform logical processing on the highest three bits of the reference data value and the highest-three-bit delay value to determine whether cross-quadrant occurs;
    a first operational circuit, configured to perform a logical operation on lower four bits of the reference data value based on a determination result of the logic circuit to obtain a lower-four-bit operation value;
    a second operational circuit, configured to obtain a lowest-bit operation value based on the determination result of the logic circuit and the phase control signal outputted by the controller;
    a one-hot code logical circuit, configured to perform one-hot code logical processing on the highest-three-bit delay value to generate the second code; and
    a thermometer code logical circuit, configured to perform thermometer code logical processing on the lower-four-bit operation value and the lowest-bit operation value to generate the first code, wherein the lowest bit of the first code is generated by separately encoding the lowest-bit operation value.

3. The phase interpolator according to claim 2, wherein in a case that the determination result of the logic circuit is that cross-quadrant occurs, the first operational circuit and the second operational circuit are configured to transfer all weights to a side of a bordering phase to change a phase once, the one-hot code logical circuit is configured to change a phase of the second code, and the thermometer code logical circuit is configured to change a phase of the first code.

4. The phase interpolator according to claim 1, wherein the data control signal and the phase control signal outputted by the controller are binary-encoded.

5. The phase interpolator according to claim 1, wherein the clock mixer comprises M current switching circuits, a third resistor, a fourth resistor, a first NMOS transistor, a second NMOS transistor, a third NMOS transistor and a fourth NMOS transistor, where M is a natural number greater than 1, wherein
    both one terminal of the third resistor and one terminal of the fourth resistor are connected with a power supply;
    the other terminal of the third resistor, a drain of the first NMOS transistor and a drain of the third NMOS transistor are connected together, with a connection point acting as an output terminal of the clock mixer;
    the other terminal of the fourth resistor, a drain of the second NMOS transistor and a drain of the fourth NMOS transistor are connected together, with a connection point acting as another output terminal of the clock mixer;
    a source of the first NMOS transistor is connected with a source of the second NMOS transistor, with a connection point connected with first output terminals of the M current switching circuits;

a source of the third NMOS transistor is connected with a source of the fourth NMOS transistor, with a connection point connected with second output terminals of the M current switching circuits;

a gate of the first NMOS transistor, a gate of the second NMOS transistor, a gate of the third NMOS transistor and a gate of the fourth NMOS transistor are used as the input terminals of the clock mixer; and input terminals of the M current switching circuits are for receiving the first code, and ground terminals of the M current switching circuits are grounded.

6. The phase interpolator according to claim 5, wherein the clock mixer further comprises (M+1) tail current providing units, a fifth resistor, a first switch and a second switch, wherein the tail current providing unit is one of a current source and a current sink:

wherein terminals of M tail current providing units of the (M+1) tail current providing units are connected with the ground terminals of the M current switching circuits in a one-to-one correspondence way;

one terminal of the first switch is connected with the first output terminals of the M current switching circuits;

one terminal of the second switch is connected with the second output terminals of the M current switching circuits;

the other terminal of the first switch, the other terminal of the second switch, one terminal of the fifth resistor and one terminal of the tail current providing unit other than the M tail current providing units of the (M+1) tail current providing units are connected together;

the other terminals of the (M+1) tail current providing units are grounded; and the other terminal of the fifth resistor is connected with the power supply.

7. The phase interpolator according to claim 5, wherein the current switching circuit comprises a fifth NMOS transistor, a sixth NMOS transistor and a seventh NMOS transistor, wherein a drain of the sixth NMOS transistor is used as the first input terminal of each of the M current switching circuits;

a drain of the seventh NMOS transistor is used as the second output terminal of each of the M current switching circuits;

a source of the sixth NMOS transistor, a source of the seventh NMOS transistor and a drain of the fifth NMOS transistor are connected together;

a gate of the sixth NMOS transistor and a gate of the seventh NMOS transistor are respectively used as two input terminals of the current switching circuit to receive two reverse signals in the first code; and a source of the fifth NMOS transistor is grounded, and a gate of the fifth NMOS transistor is for receiving a bias voltage.

8. The phase interpolator according to claim 6, wherein the current switching circuit comprises a fifth NMOS transistor, a sixth NMOS transistor and a seventh NMOS transistor, wherein a drain of the sixth NMOS transistor is used as the first input terminal of each of the M current switching circuits;

a drain of the seventh NMOS transistor is used as the second output terminal of each of the M current switching circuits;

a source of the sixth NMOS transistor, a source of the seventh NMOS transistor and a drain of the fifth NMOS transistor are connected together;

a gate of the sixth NMOS transistor and a gate of the seventh NMOS transistor are respectively used as two input terminals of the current switching circuit to receive two reverse signals in the first code; and a source of the fifth NMOS transistor is grounded, and a gate of the fifth NMOS transistor is for receiving a bias voltage.

9. The phase interpolator according to claim 1, wherein each of the two multiplexers comprises two selection circuits, and each of the two selection circuits comprises:

N first NMOS transistors, wherein sources of every two of the N first NMOS transistors are connected together, gates of the every two of the N first NMOS transistors are for receiving two phase clocks having a phase difference of 180 degrees respectively, drains of the first NMOS transistors for receiving adjacent phase clocks are connected together, and connection points of the drains of the first NOMS transistors are used as two output terminals of the selection circuit;

N/2 second NMOS transistors, wherein a drain of each of the second NMOS transistors is connected with a connection point of the sources of the every two of the first NMOS transistors, sources of the N/2 second NMOS transistors are connected together, and gates of the N/2 second NMOS transistors are for receiving the second code;

a third NMOS transistor, wherein a source of the third NMOS transistor is grounded, a gate of the third NMOS transistor is for receiving a bias voltage, and a drain of the third NMOS transistor is connected with a connection point of the sources of the second NMOS transistors; and a load connected with the two output terminals of the selection circuit, and configured to perform swing limit on received N phase clocks.

10. The phase interpolator according to claim 9, wherein the load comprises a first resistor and a second resistor, wherein one terminal of the first resistor is connected with one output terminal of the selection circuit;

one terminal of the second resistor is connected with the other output terminal of the selection circuit; and the other terminal of the first resistor is connected with the other terminal of the second resistor, with a connection point connected with a power supply.

11. A phase interpolator for a clock and data recovery circuit, wherein the phase interpolator is connected with a controller of the clock and data recovery circuit, and the phase interpolator comprises:

an encoding circuit, wherein an input terminal of the encoding circuit is connected with the controller, and the encoding circuit is configured to: sample a data control signal outputted by the controller based on a received parallel clock to generate a sampled signal, sample the sampled signal based on a received sampling clock or a received multi-phase clock group to determine a reference data value, and process the reference data value and a phase control signal outputted by the controller to generate a first code;

N clock mixers, wherein a control terminal of each of the N clock mixers is connected with an output terminal of the encoding circuit, and the N clock mixers are configured to receive the first code, and select two phase clocks from received N phase clocks based on the first code and perform a weighting analog operation on the two phase clocks to generate and output a new phase clock, where N is an even number greater than or equal to 4; and two differential to single-ended amplifiers, wherein an input terminal of each of the two differential to single-ended amplifiers is connected with an output terminal of each of the clock mixers, and each of the two differential to single-ended amplifiers is configured to amplify a small signal outputted by the N clock mixers to a full swing signal.

12. A clock and data recovery circuit, comprising:

a phase-locked loop, configured to output N phase clocks, where N is an even number greater than or equal to 4;

a controller, configured to receive a parallel clock and parallel data, generate and output a data control signal and a phase control signal; and a phase interpolator, wherein the phase interpolator is connected with a controller of the clock and data recovery circuit, and the phase interpolator comprises:

an encoding circuit, wherein an input terminal of the encoding circuit is connected with the controller, and the encoding circuit is configured to: sample a data control signal outputted by the controller based on a received parallel clock to generate a sampled signal, sample the sampled signal based on a received sampling clock or a received multi-phase clock group to determine a reference data value, and process the reference data value and a phase control signal outputted by the controller to generate a first code and a second code;

two multiplexers, wherein a control terminal of each of the two multiplexers is connected with an output terminal of the encoding circuit, and each of the two multiplexers is configured to receive the second code, select two phase clocks from received N phase clocks based on the second code, and output the selected two phase clocks, where N is an even number greater than or equal to 4;

a clock mixer, wherein a control terminal of the clock mixer is connected with an output terminal of the encoding circuit, input terminals of the clock mixer is connected with output terminals of the two multiplexers, the clock mixer is configured to receive the first code, perform a weighting analog operation on the received two phase clocks based on the first code to generate and output a new phase clock; and two differential to single-ended amplifiers, wherein an input terminal of each of the two differential to single-ended amplifiers is connected with an output terminal of the clock mixer, and each of the two differential to single-ended amplifiers is configured to amplify a small signal outputted by the clock mixer to a full swing signal.

13. The clock and data recovery circuit according to claim 12, further comprising:

a receiving circuit, connected with an output terminal of the phase interpolator for the clock and data recovery circuit and configured to receive sampled data and the full swing signal outputted by the phase interpolator for the clock and data recovery circuit; and a serial-to-parallel conversion circuit, wherein an input terminal of the serial-to-parallel conversion circuit is connected with an output terminal of the receiving circuit and an output terminal of the phase interpolator for the clock and data recovery circuit, and the serial-to-parallel conversion circuit is configured to receive the sampled data and the full swing signal, perform a serial-to-parallel conversion on the sampled data, to generate the parallel clock, the parallel data and the sampling clock or the multi-phase clock group.

* * * * *